United States Patent [19]
Fujii

[11] Patent Number: 5,801,562
[45] Date of Patent: Sep. 1, 1998

[54] VARIABLE DELAY CIRCUIT

[75] Inventor: Haruhiko Fujii, Tokyo, Japan

[73] Assignee: Ando Electric Co., Ltd., Tokyo, Japan

[21] Appl. No.: 687,037

[22] Filed: Jul. 25, 1996

[30] Foreign Application Priority Data

Jul. 28, 1995 [JP] Japan .................. 7-212378

[51] Int. Cl.$^6$ .................................................. H03K 5/00
[52] U.S. Cl. .................. 327/149; 326/93; 327/144; 327/146; 327/153; 327/161; 327/163; 327/162
[58] Field of Search ........................ 326/93; 327/278, 327/149, 144, 146, 153, 161, 162, 163; 307/269; 368/120

[56] References Cited

U.S. PATENT DOCUMENTS

| | | | |
|---|---|---|---|
| 5,184,027 | 2/1993 | Masuda et al. | 307/269 |
| 5,491,673 | 2/1996 | Okayasu | 368/120 |
| 5,497,263 | 3/1996 | Masuda et al. | 327/278 |

Primary Examiner—Viet Q. Nguyen
Attorney, Agent, or Firm—Finnegan, Henderson, Farabow, Garrett & Dunner, L.L.P.

[57] ABSTRACT

A variable delay circuit is disclosed comprising first and second clock delay sections, first and second phase comparison circuits, first and second data delay sections, and a selector. The first and second clock delay sections delay a clock signal to generate first and second delayed clock signals. The first and second phase comparison circuits respectively detect a phase difference between the clock signal and the first delayed clock signal and a phase difference between the clock signal and the second delayed clock signal. The first and second phase comparison circuits then respectively supply first and second delay control signals indicating the phase differences to the first and second clock delay sections so as to equalize the delay times of the clock delay sections to a period of the clock signal. The first and second data delay circuits delay a data signal. The delay times of the first and second data delay sections are respectively controlled based on the first and second delay control signals so as to be proportional to the period of the clock signal. One of the output signals of the first and second data delay sections is selected by the selector based on a delay designating data.

5 Claims, 6 Drawing Sheets

VARIABLE DELAY CIRCUIT

BACKGROUND OF THE INVENTION

1. Field of the Invention

The present invention relates to a variable delay circuit used for logical circuits to control phases of signals transmitted in the circuits.

2. Background Art

FIG. 6 is a block diagram showing a configuration of an example of a conventional variable delay circuit.

In FIG. 6, 2 designates a data input terminal; 3 designates a data output terminal; 4 designates a delay designating data input terminal; 84 designates a delay gate; 9 designates a selector; 2A designates a data signal to be delayed by the variable delay circuit; and 4A designates a delay designating data.

The data signal 2A to be delayed is supplied to the data input terminal 2 and this data signal is inputted to one of two data input terminals of the selector 9 and to an input terminal of the delay gate 84. The output signal of the delay gate 84 is inputted to another data input terminal of the selector 9. The selector 9 receives the delay designating data 4A via the delay designating data input terminal 4. The selector 9 then selects the data signal 2A or the output signal of the delay gate 84 according to the delay designating data and outputs the selected signal to the data output terminal 3.

FIG. 7 is a block diagram showing a configuration of another example of a conventional variable delay circuit.

The members which are identical to those of the variable delay circuit shown in FIG. 6 are designated by the same reference numerals as those of the variable delay circuit, and the description thereof will therefore be omitted.

In the variable delay circuit shown in FIG. 7, a delay gate 83 is further provided. The delay gate 83 has a delay time which is different from that of the delay gate 84. The data signal 2A is supplied to the delay gates 83 and 84 and the output signals of these delay gates are inputted to the data input terminals of the selector 9. The selector 9 then selects one of the output signals of the delay gates 83 and 84 according to the delay designating data 4A and outputs the selected signal to the data output terminal 3.

In the conventional variable delay circuits as described above, the data input signal 2A is delayed by a delay time which is selected according to the delay designating data.

However, it is impossible to freely control the delay time of the variable delay circuits at a desired time resolution. For example, the resolution of the delay time of the variable delay circuit shown in FIG. 6 is determined by the delay time of the delay gate 84. It is impossible to control the delay time of the variable delay circuit at a shorter duration than the delay time of the delay gate 84. In the variable delay circuit shown in FIG. 7, the resolution of the delay time is determined by the difference between the delay times of the delay gates 83 and 84.

SUMMARY OF THE INVENTION

Accordingly, it is an object of the present invention to provide a variable delay circuit, the delay time of which can be freely controlled to a desired time resolution.

In an aspect of the present invention, there is provided a variable delay circuit comprising clock delay means for delaying a clock signal by a delay time to generate a delayed clock signal; phase comparison means for detecting a phase difference between the clock signal and the delayed clock signal and for supplying a delay control signal indicating the phase difference to the clock delay means so as to equalize the delay time of the clock delay means to a period of the clock signal; and data delay means for delaying a data signal, a delay time of the data delay means being controlled based on the delay control signal so as to be proportional to the period of the clock signal.

The present invention further provides a variable delay circuit comprising a plurality of delay control signal generating sections for generating a plurality of delay control signals; a plurality of data delay sections for delaying a data signal, delay times of the data delay sections being respectively controlled based on the delay control signals; and a selector for selecting one of output signals of the data delay sections based on a delay designating data, wherein each one of delay control generating sections comprises a clock delay section for delaying the clock signal by a delay time to generate a delayed clock signal; a phase comparison circuit for detecting a phase difference between the clock signal and the delayed clock signal, and for supplying a phase difference signal indicating the phase difference to the first clock delay section so as to equalize the delay time of the first clock delay section to a period of the clock signal, and for outputting the phase difference signal as one of the delay control signals.

The present invention further provides a variable delay circuit comprising a first clock delay section for delaying a clock signal to generate a first delayed clock signal; a first phase comparison circuit for detecting a phase difference between the clock signal and the first delayed clock signal and for supplying a first delay control signal indicating the phase difference to the first clock delay section so as to equalize a delay time of the first clock delay section to a period of the clock signal; a second clock delay section for delaying the clock signal to generate a second delayed clock signal; a second phase comparison circuit for detecting a phase difference between the clock signal and the second delayed clock signal and for supplying a second delay control signal indicating the phase difference to the second clock delay section so as to equalize a delay time of the second clock delay section to the period of the clock signal; a first data delay line consisting of a plurality of delay elements which are connected in a cascade, the delay times of the delay elements being controlled based on the first delay control signal so as to be proportional to the period of the clock signal; a second data delay line consisting of a plurality of delay elements which are connected in a cascade for delaying a data signal, the delay times of the delay elements being controlled based on second delay control signal; and a switch inserted between the first and second delay lines for transmitting a signal on a node of the first delay line to a node of the second delay line, the node of the first delay line and the node of the second delay line being selected based on a delay designating data.

According to the present invention, the total delay time applied to the data signal is controlled so as to be proportional to the period of the clock signal. Therefore, the total delay time can be accurately controlled at a desired time resolution regardless of disturbances such as variations of temperature, noise in a supply voltage, and the like.

DETAILED DESCRIPTION OF THE PREFERRED EMBODIMENTS

Hereinbelow, preferred embodiments of the present invention will be explained with reference to the Figures.
A. First Preferred Embodiment of the Present Invention FIG. 1 is a block diagram showing the configuration of a variable delay circuit according to a first preferred embodiment of the present invention, which is the best mode.

Figure 6:
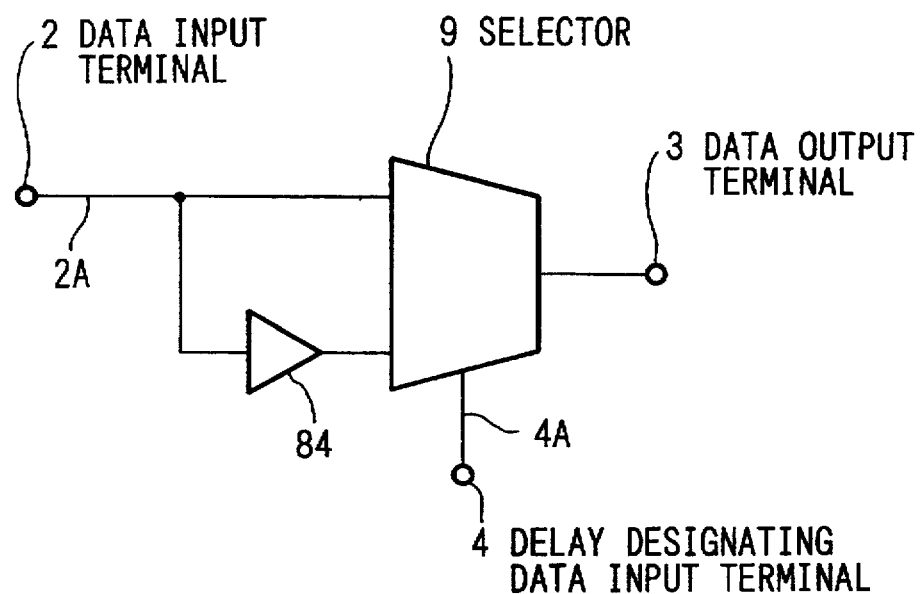
FIG. 6 is a block diagram showing the configuration of an example of a conventional variable delay circuit.
Figure 7:
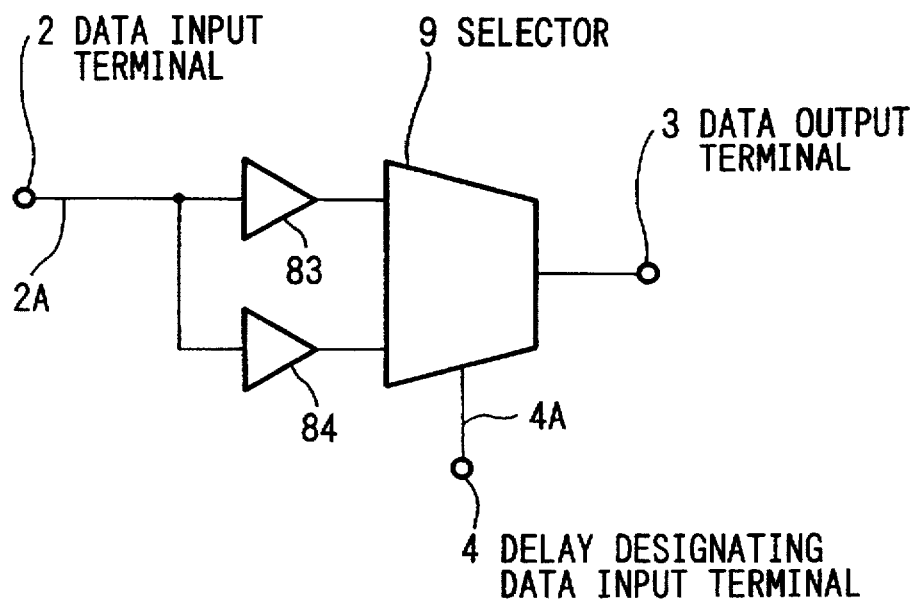
FIG. 7 is a block diagram showing the configuration of another example of a conventional variable delay circuit.

The members which are identical to those of the variable delay circuit shown in FIG. 6 or 7 are designated by the same reference numerals as those of the variable delay circuit, and the description thereof will be omitted.

Figure 1:
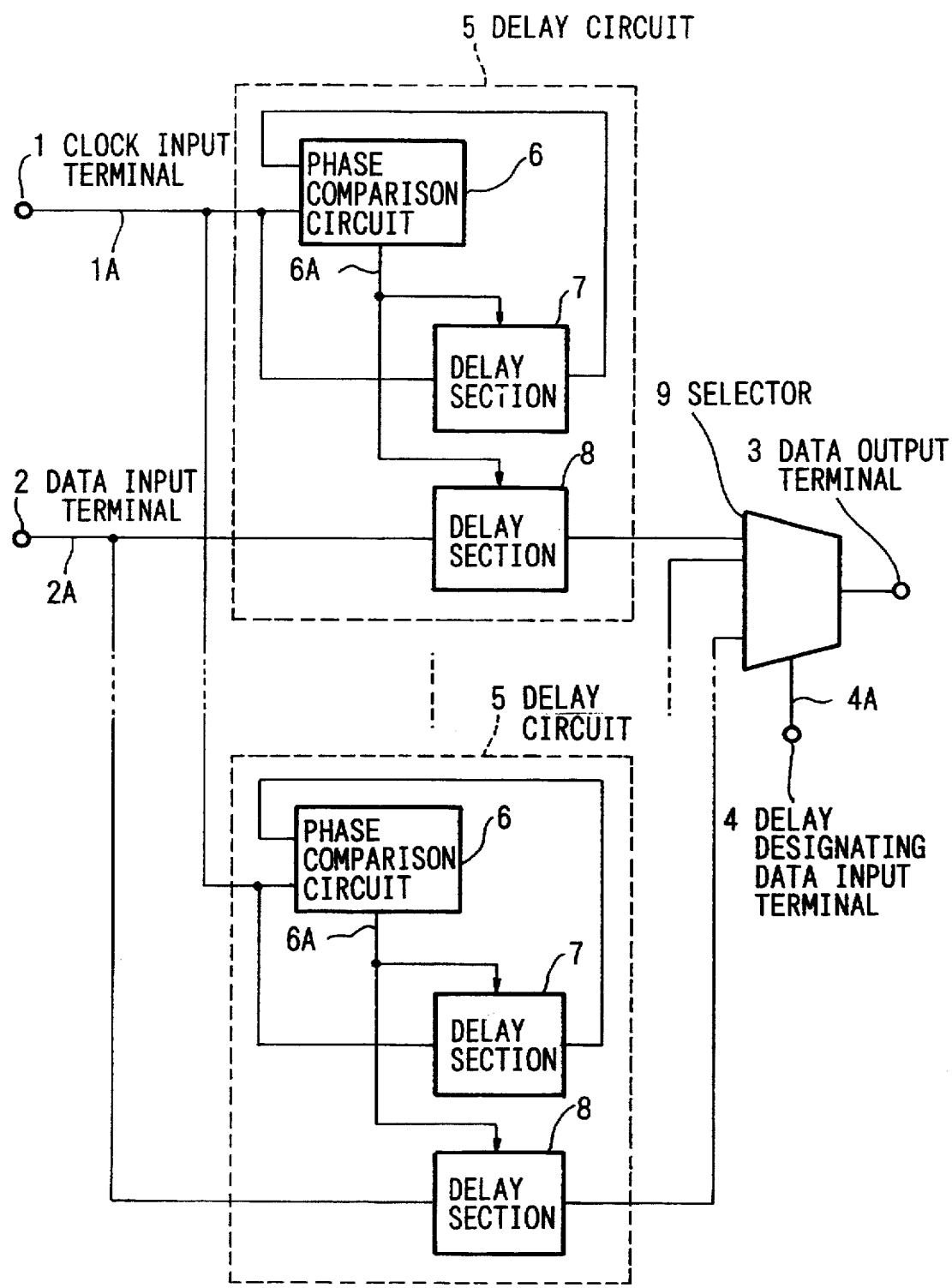
FIG. 1 is a block diagram showing the configuration of a variable delay circuit according to a first preferred embodiment of the present invention.

In the variable delay circuit shown in FIG. 1, a plurality of delay circuits 5 are provided instead of the delay gates 83 and 84 shown in FIG. 7.

The data signal 2A to be delayed is supplied to these delay circuits via the data input terminal 2.

A clock input terminal 1 is provided in the variable delay circuit to receive a clock signal 1A. The clock signal 1A is supplied to the delay circuits 5.

Each delay circuit 5 has a phase comparison circuit 6, and delay sections 7 and 8.

The clock signal 1A is supplied to one of input terminals of the comparison circuit 6 and to the delay section 7. The delay section 7 is a clock delay device which delays the clock signal 1A thus inputted and supplies the delayed clock signal to another input terminal of the phase comparison circuit 6. The delay time of the delay section 7 is variable and is controlled based on an electrical delay control signal 6A.

The phase comparison circuit 6 compares the delayed clock signal supplied from the delay section 7 with the clock signal 1A and outputs a phase difference signal indicating the phase difference between the clock signal 1A and the delayed clock signal. The phase difference signal is supplied to the delay section 7 as the above-described delay control signal 6A.

In a closed-loop constituted by the phase comparison circuit 6 and the delay section 7, the phase difference between the clock signal 1A and the delayed clock signal is detected by the phase comparison circuit 6, and the delay time of the delay section 7 is controlled based on the phase difference so as to be equal to the period of the clock signal 1A.

The delay section 8 is data delay device which delays the data signal 2A supplied via the data input terminal 2 and outputs the data signal thus delayed to one of the data input terminals of the selector 9. The delay time of the delay section 8 is also variable and is controlled based on the delay control signal 6A.

The delay times of the delay sections 7 and 8 are controlled based on the same delay control signal 6A. Therefore, the delay time of the delay section 8 is controlled so as to be proportional to the delay time of the delay section 7.

As described-above, the delay time of the delay section 7 is controlled so as to be equal to the period of the clock signal 1A. Therefore, the delay time of the delay section 8 is controlled so as to be proportional to the period of the clock signal 1A at a predetermined ratio.

The other delay circuits 5, 5, . . . also have a phase comparison circuit 6, and delay sections 7 and 8 which have the same configuration as described above. In each delay circuit 5, the ratio of the delay times of the delay sections 7 and 8 is determined so that the data signal 2A is delayed by the delay section 8 by a delay time which is required for the delay circuit. In the case where all the delay circuits 5, 5, . . . have different ratios of delay times, the data signal 2A is delayed by the delay circuits by different delay times and the delayed data signals having different phases are obtained.

The selector 9 selects one of the delayed data signals outputted from the delay circuits 5, 5, . . . based on the delay designating data 4A, which is inputted via the delay designating data input terminal 4, and outputs the delayed data signal thus selected to the data output terminal 3.

Therefore, the delayed data signal having a desired delay time can be obtained by supplying an appropriate delay designating data to the selector 4. Furthermore, the delay time of the delay section 8 of each delay circuit 5 is controlled so as to be proportional to the period of the clock signal 1A. Therefore, the resolution of the delay time of the variable delay circuit can be set to a desired value by controlling the period of the clock.

Figure 2:
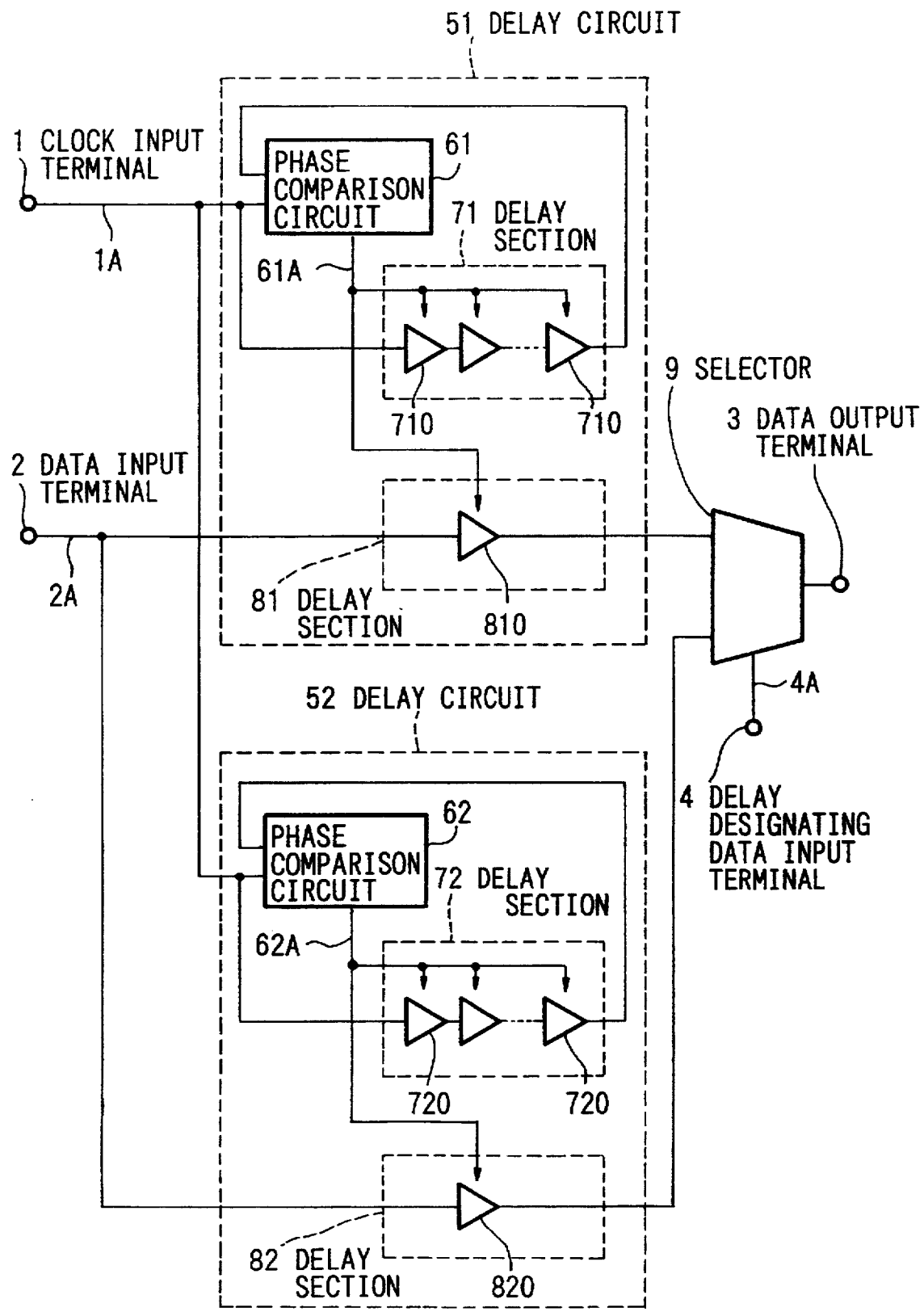
FIG. 2 is a block diagram showing the configuration of a concrete example of the first preferred embodiment.

FIG. 2 is a block diagram showing the configuration of a concrete example of the first preferred embodiment.

The members which are identical to those of the variable delay circuit shown in FIG. 1 are designated by the same reference numerals as of the variable delay circuit, and the description thereof will be omitted.

Delay circuits 51 and 52 are the concrete examples of the delay circuits 5, 5, . . . shown in FIG. 1.

The delay circuit 51 has a phase comparison circuit 61, and delay sections 71 and 81, which respectively correspond to the phase comparison circuit 6, and the delay sections 7 and 8 shown in FIG. 1.

The delay section 71 has ten delay gates 710 which have the same configuration and electrical characteristics and are connected in a cascade. The delay section 81 has a delay gate 810 and this delay gate has the same configuration and electrical characteristics as each one of the delay gates 710.

The delay times of the delay gates 710, 710, . . . and the delay gate 810 are controlled based on a delay control signal 61A generated by the phase comparison circuit 61.

In the delay circuit 51, therefore, the delay time of the delay section 81 is equal to 1/10 of the delay time of the delay section 71.

Therefore, in the case where the clock signal 1A is supplied to the clock input terminal 1 at a period of 90 ns, the delay time of the delay section 71 is equal to 90 ns and the delay time of the delay section 81 is equal to 9 ns.

On the other hand, the delay circuit 52 has a phase comparison circuit 62, and delay sections 72 and 82, which respectively correspond to the phase comparison circuit 6, and the delay sections 7 and 8 shown in FIG. 1.

The delay section 72 has nine delay gates 720 which have the same configuration and electrical characteristics and are connected in a cascade. The delay section 81 has a delay gate 820 and this delay gate has the same configuration and electrical characteristics as each one of the delay gates 720.

The delay times of the delay gates 720, 720, . . . and the delay gate 820 are controlled based on a delay control signal 62A generated by the phase comparison circuit 62.

In the delay circuit 52, therefore, the delay time of the delay section 82 is equal to 1/9 of the delay time of the delay section 72.

Therefore, in the case where the clock signal 1A is supplied to the clock input terminal 1 at a period of 90 ns, the delay time of the delay section 72 is equal to 90 ns and the delay time of the delay section 82 is equal to 10 ns.

The data signal 2A inputted via the data input terminal 2 is delayed by the delay sections 81 and 82 respectively by 9 ns and 10 ns.

The selector 9 selects one of the delayed data signals outputted from the delay sections 81 and 82 based on the delay designating data 4A and outputs the delayed data signal thus selected to the data output terminal 3.

In this manner, the delay time of the variable delay circuit can be controlled at a resolution time of 1 ns. The resolution time may be changed by changing the period of the clock signal 1A as described above if necessary.

Figure 3:
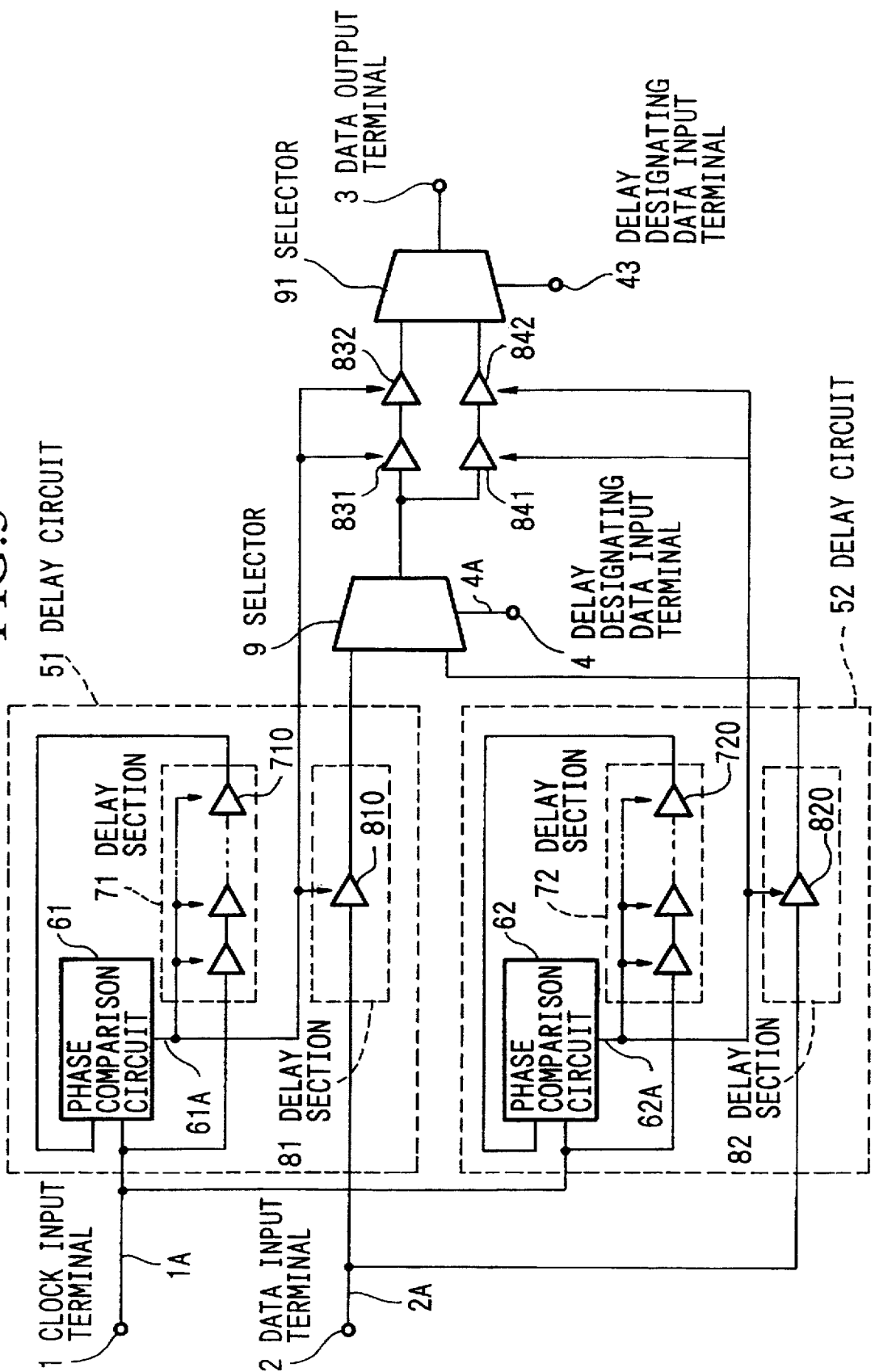
FIG. 3 is a block diagram showing the configuration of another concrete example of the first preferred embodiment.

FIG. 3 is a block diagram showing the configuration of another concrete example of a variable delay circuit according to the first preferred embodiment.

This variable delay circuit has delay gates 831, 832, 841 and 842, and a selector 91 which are inserted between the output terminal of the selector 9 and the data output terminal 3.

The other members of the variable delay circuit are identical to those of the variable delay circuit shown in FIG. 2.

The delay gates 831 and 832 have the same configuration and electrical characteristics as the delay gate 810. The delay times of the delay gates 831 and 832 are controlled by the delay control signal 61A which is also used for controlling the delay time of the delay gate 810. Therefore, if the period of the clock signal 1A is 90 ns, the delay times of the delay gates 810, 831 and 832 are controlled so as to be equal to 9 ns.

The delay gates 841 and 842 have the same configuration and electrical characteristics as the delay gate 820. The delay times of the delay gates 841 and 842 are controlled by the delay control signal 62A which is also used for controlling the delay time of the delay gate 820. Therefore, if the period of the clock signal 1A is 90 ns, the delay times of the delay gates 820, 841 and 842 are controlled so as to be equal to 10 ns.

Thus, the delay gates 831 and 832 delay the output signal of the selector 9 by 18 ns. The delay gates 841 and 842 delay the output signal of the selector 9 by 20 ns.

The selector 91 selects one of the output signals of the delay gates 832 and 842 based on a delay designating data inputted via a delay designating data input terminal 43 and outputs the signal thus selected to the data output terminal 3.

In the variable delay circuit, the delay time between the data input terminal 2 and the data output terminal 3 can be selected from among four kinds of the delay times by the delay designating data at a resolution time of 1 ns. The resolution time may be changed by changing the period of the clock signal 1A as described above, if necessary.

In the example shown in FIG. 3, a variable delay circuit made up of the delay gates 831, 832, 841, and 842, and the selector 91 is inserted between the selector 9 and the data output terminal 3. However, two or more variable delay circuits may be inserted between the selector 9 and the data output terminal 3 in order to increase the number of the delay times which can be selected.

B. Second preferred embodiment

Figure 4:
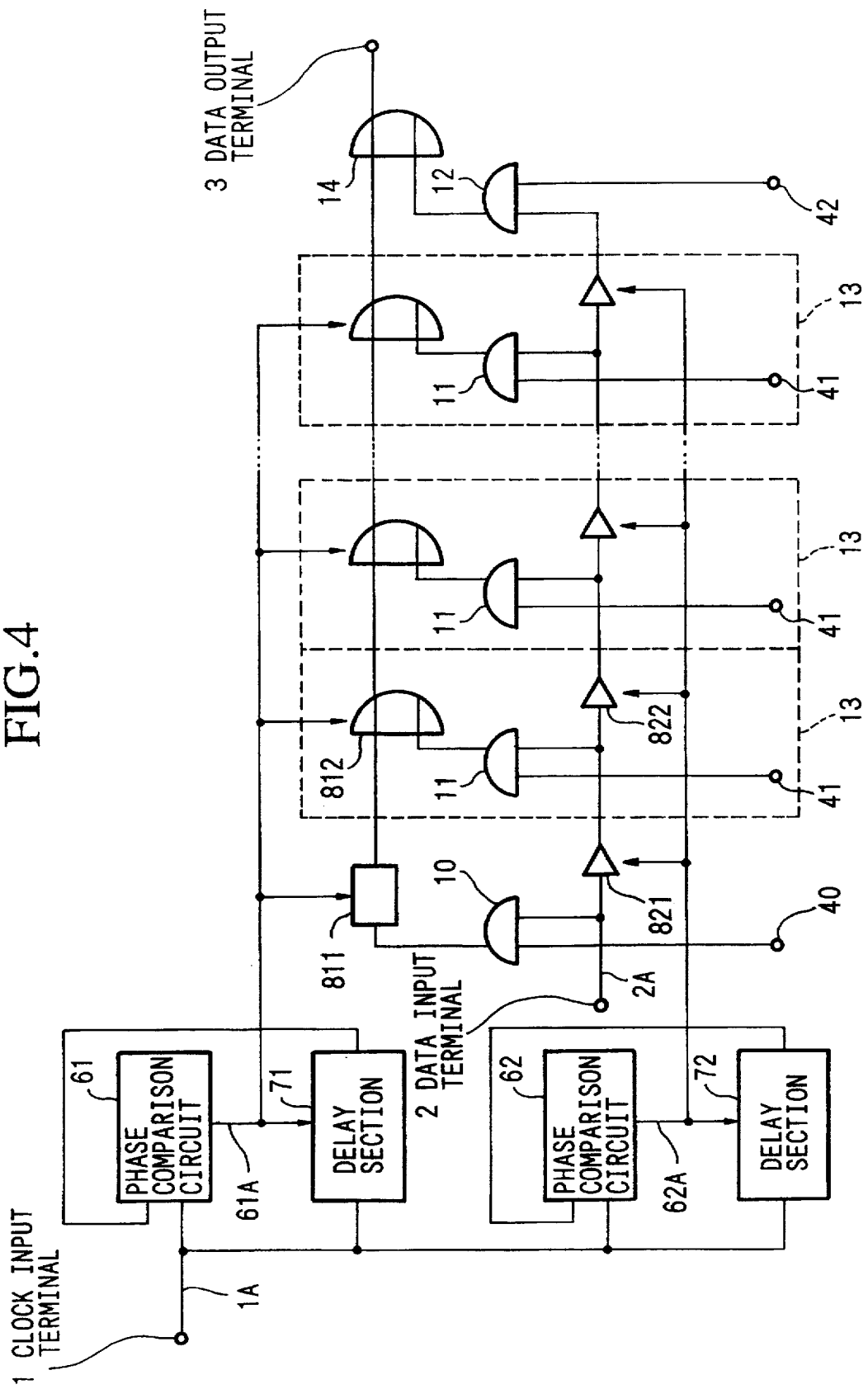
FIG. 4 is a block diagram showing the configuration of a variable delay circuit according to a second preferred embodiment of the present invention.

FIG. 4 is a block diagram showing the configuration of a variable delay circuit according to a second preferred embodiment of the present invention.

In the variable delay circuit shown in FIG. 4, a phase comparison circuit 61 and a delay section 71 form a first closed-loop for generating a first delay control signal 61A based on a clock signal 1A from an clock input terminal 1.

More specifically, the clock signal 1A is supplied to one of the input terminals of the comparison circuit 61 and to the delay section 71. The delay section 71 delays the clock signal 1A and supplies the delayed clock signal to another input terminal of the phase comparison circuit 61.

The phase comparison circuit 61 detects the phase difference between the delayed clock signal and the clock signal 1A. The phase comparison circuit 61 then generates the first delay control signal 61A indicating the detected phase difference to control the delay time of the delay section 71.

Under this feed-back control, the delay time of the delay section 71 is equal to the period of the clock signal 1A.

Similarly, a phase comparison circuit 62 and a delay section 72 form a second closed-loop for generating a second delay control signal 62A based on the clock signal 1A.

A data signal 2A to be delayed is supplied to a data input terminal 2. The data signal 2A thus supplied is supplied to one of the input terminals of an AND gate 10 and to an input terminal of a delay gate 821.

A plurality of delay gate circuits 13, 13, ... which are connected in a cascade are provided in the variable delay circuit. Each delay gate circuit 13 has an AND gate 11, and an OR gate 812 having a delay function, and a delay gate 822.

The output signal of the delay gate 811 is supplied to the OR gate 812 of the first stage of the delay gate circuit 13. The output signal of the delay gate 821 is supplied to the delay gate 822 and the AND gate 11 of the first stage of the delay gate circuit 13.

The output signal of the OR gate 812 of the last stage of the delay gate circuit 13 is supplied to one of the input terminals of an OR gate 14. The output signal of the delay gate 822 of the last stage of the delay gate circuit 13 is supplied to one of the input terminals of an AND gate 12. The output signal of the AND gate 12 is supplied to another input terminal of the OR gate 14. The output signal of the OR gate 14 is supplied to a data output terminal 3.

The delay times of the delay gate 811, and of the OR gates 812, 812, ... are controlled based on the first delay control signal 61A. As described above, the delay time of the delay section 71 is controlled by the first delay control signal 61A so as to be equal to the period of the clock signal 1A. Therefore, the delay times of the delay gate 811 and the OR gates 812, 812, ... are controlled so as to be proportional to the period of the clock signal 1A by predetermined ratios. The delay gate and the OR gates thus controlled constitute a first delay line for delaying the data signal 2A.

The delay times of the delay gate 821, and of the delay gates 822, 822, ... are controlled based on the second delay control 62A so as to be proportional to the period of the clock signal 1A by predetermined ratios. These delay gates thus controlled constitute a second delay line for delaying the data signal 2A.

The AND gates 10, 11, 11, ... , 11, 12 are inserted between the first delay line and the second delay line. Delay designating data input terminals 40, 41, 41, ... , 41, 42 are provided for inputting delay designating data to these AND gates.

In these delay designating data thus supplied, one of them has a high level and the others have low levels. Therefore, one of the AND gates 10, 11, 11, ... , 11, 12 is selected by a delay designating data having a high level and the signal propagating in the second delay line is transmitted to the first delay line via the selected AND gate.

That is to say, the AND gates 10, 11, 11, ..., 11, 12 constitute switch means for connecting a part of the first delay line and a part of the second delay line to form a delay line for delaying the data signal 2A based on the delay designating data supplied via the input terminals 40, 41, 41, ..., 41, 42.

In the variable delay circuit, therefore, the total delay time between the data input terminal 2A and the data output terminal 3 can be controlled by supplying the delay designating data.

Figure 5:
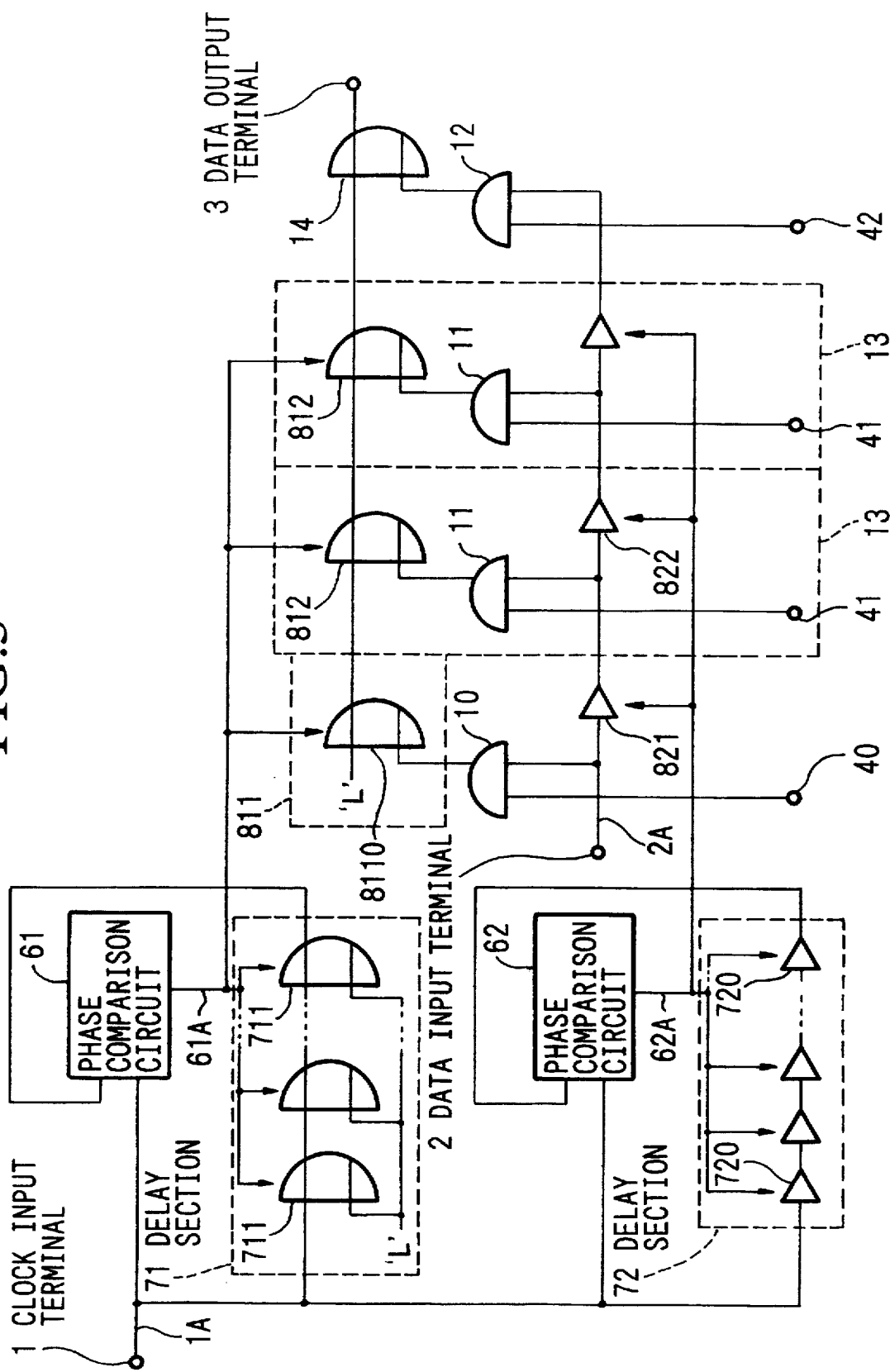
FIG. 5 is a block diagram showing the configuration of a concrete example of the second preferred embodiment.

FIG. 5 is a block diagram showing the configuration of a concrete example of a variable delay circuit according to the second preferred embodiment.

The members which are identical to those of the variable delay circuit shown in FIG. 4 are designated by the same reference numerals as those of the variable delay circuit.

In this variable delay circuit, the delay section 71 is made up of ten OR gates 711 which have delay functions and are connected in a cascade. One of terminals of each OR gate 711 is fixed to a low level. The clock signal 1A is supplied to the first stage of the OR gate 711 and is delayed by the ten OR gates 711.

The delay section 72 is made up of nine delay gates 720 which are connected in a cascade. The clock signal 1A is supplied to the first stage of the delay gates 720 and is delayed by the nine delay gates 720.

The delay gate 811 is made up of an OR gate 8110, one terminal of which is fixed to a low level. Two delay gate circuits 13 and 13 are provided and each delay gate circuit has the OR gate 812, the delay gate 822, and the AND gate 11.

The OR gates 711, 711, ... of the delay section 71, the OR gate 8110, and the OR gates 812 and 812 of the delay gate circuits 13 and 13 have the same configuration and electrical characteristics.

The delay times of the ten OR gates of the delay section 71 and the delay times of the OR gates 8110, 812 and 812 are controlled based on the first delay control signal 61A generated by the phase comparison circuit 61.

The delay times of the nine delay gates 720 and the delay times of the delay gates 821, 822, and 822 are controlled based on the second delay control signal 62A generated by the phase comparison circuit 62.

In the case where the clock signal 1A having a period of 90 ns is supplied to the clock input terminal 1A, the phase comparison circuit 61 generates the first delay control signal 61A to control the delay time of the ten OR gates 711 so as to equal the total delay time of the OR gates to the period of the clock signal 1A, i.e., 90 ns. The delay times of the OR gates 8110, 8112 and 812 are controlled based on the first delay control signal 61A thus generated. Therefore, the delay times of the OR gates 8110, 812 and 812 are equal to 9 ns.

On the other hand, the phase comparison circuit 62 generates the second delay control signal 62A to control the delay time of the nine delay gate 720 so as to equal the total delay time of the delay gates to the period of the clock signal 1A, i.e., 90 ns. The delay times of the delay gates 821, 822 and 822 are controlled based on the second delay control signal 62A thus generated. Therefore, the delay times of the delay gates 821, 822, and 822 are equal to 10 ns.

In the variable delay circuit, therefore, the total delay time between the data input terminal 2A and the data output terminal 3 can be controlled at a resolution time of 1 ns by supplying the delay designating data, one of which has a high level and the other have a low level, to the input terminals 40, 41, 41 and 42.

What is claimed is:

1. A variable delay circuit comprising:

a plurality of clock delay means for delaying a clock signal by a delay time to generate a plurality of delayed clock signals;

a plurality of phase comparison means for detecting respective phase differences between the clock signal and the plurality of delayed clock signals and for supplying a plurality of delay control signals indicating the respective phase differences to the respective clock delay means so as to equalize the respective delay times of the plurality of clock delay means to a period of the clock signal;

a plurality of data delay means for respectively delaying data signals obtained from a data input terminal and outputting delayed data signals to a data output terminal, respective delay times of the plurality of data delay means being controlled based on the respective delay control signals so as to be proportional to the period of the clock signal; and route switch means for selecting, based on a delay designating data, one among a plurality of routes extending from the data input terminal through the respective data delay means to the data output terminal.

2. A variable delay circuit comprising:

a plurality of delay control signal generating sections for generating a plurality of delay control signals;

a plurality of data delay sections for delaying a data signal, delay times of the data delay sections being respectively controlled based on the delay control signals; and a selector for selecting one of output signals of the data delay sections based on a delay designating data, wherein each one of the delay control signal generating sections comprises:

a clock delay section for delaying a clock signal by a delay time to generate a delayed clock signal; and a phase comparison circuit for detecting a phase difference between the clock signal and the delayed clock signal, and for supplying a phase difference signal indicating the phase difference to the clock delay section so as to equalize the delay time of the clock delay section to a period of the clock signal, and for outputting the phase difference signal as one of the delay control signals.

3. A variable delay circuit according to claim 2, wherein each clock delay section has multiple stage delay elements, and each data delay section has a unit stage delay element, and the delay time of each data delay section is controlled so as to have a delay time which is obtained by dividing the period of the clock signal by the stage numbers of the multiple stage delay elements.

4. A variable delay circuit according to claim 2, further comprising one or more delay circuits connected in a cascade for delaying the output signal of the selector, each delay circuit comprising:

a plurality of variable delay elements for delaying an input signal supplied thereto, the delay times of the variable delay elements being controlled based on the delay control signals; and a selector for selecting one output of the variable delay elements based on the delay designating data.

5. A variable delay circuit comprising:

a first clock delay section for delaying a clock signal to generate a first delayed clock signal;

a first phase comparison circuit for detecting a first phase difference between the clock signal and the first delayed clock signal and for supplying a first delay control signal indicating the first phase difference to the first clock delay section so as to equalize a delay time of the first clock delay section to a period of the clock signal;

a second clock delay section for delaying the clock signal to generate a second delayed clock signal;

a second phase comparison circuit for detecting a second phase difference between the clock signal and the second delayed clock signal and for supplying a second delay control signal indicating the second phase difference to the second clock delay section so as to equalize a delay time of the second clock delay section to the period of the clock signal;

a first data delay line consisting of a plurality of first delay elements which are connected in a cascade, the delay times of the first delay elements being controlled based on the first delay control signal so as to be proportional to the period of the clock signal;

a second data delay line consisting of a plurality of second delay elements which are connected in a cascade for delaying a data signal, the delay times of the second delay elements being controlled based on the second delay control signal so as to be proportional to the period of the clock signal; and switch means inserted between the first and second delay lines for transmitting a signal on a node of the second delay line to a node of the first delay line, the node of the first delay line and the node of the second delay line being selected based on a delay designating data.

* * * * *